United States Patent
Godo et al.

(10) Patent No.: US 8,912,016 B2
(45) Date of Patent: Dec. 16, 2014

(54) MANUFACTURING METHOD AND TEST METHOD OF SEMICONDUCTOR DEVICE

(75) Inventors: Hiromichi Godo, Isehara (JP); Shuhei Yoshitomi, Ayase (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 669 days.

(21) Appl. No.: 13/162,706

(22) Filed: Jun. 17, 2011

(65) Prior Publication Data

US 2011/0318851 A1    Dec. 29, 2011

(30) Foreign Application Priority Data

Jun. 25, 2010   (JP) ................. 2010-145410

(51) Int. Cl.
   *G01R 31/26*      (2014.01)
   *H01L 21/66*      (2006.01)
   *H01L 21/00*      (2006.01)
   *H01L 21/84*      (2006.01)
   *G01R 31/311*     (2006.01)

(52) U.S. Cl.
   CPC ........... *G01R 31/2625* (2013.01); *H01L 22/14* (2013.01); *G01R 31/311* (2013.01)
   USPC ....................... 438/17; 438/149; 257/E21.529

(58) Field of Classification Search
   CPC .................. H01L 21/02532; H01L 21/02672; H01L 21/02686; H01L 21/02691; H01L 21/67242; H01L 21/66
   USPC ............. 438/10–13, 14, 17, 18, 20, 149, 158; 257/E21.521, E21.529, E21.531, 257/E21.372, E21.411
   See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Calvin Choi
(74) *Attorney, Agent, or Firm* — Eric J. Robinson; Robinson Intellectual Property Law Office, P.C.

(57) ABSTRACT

Provided is a test method by which a transistor whose reliability is low can be detected with low stress and high accuracy in a shorter period of time than a BT test. Provided is to detect a transistor whose reliability is high in a shorter period of time than a BT test and manufacture an electronic device with high reliability efficiently. Hysteresis characteristics revealed in the result of the Vg-Id measurement with light irradiation to the transistor correlate with the result of a BT test; whether the reliability of the transistor is Good or Not-Good can be judged. Accordingly, the test method by which a transistor whose reliability is low can be detected with low stress and high accuracy in a shorter period of time than a BT test can be provided.

15 Claims, 10 Drawing Sheets

(56) References Cited

U.S. PATENT DOCUMENTS

| | | | |
|---|---|---|---|
| 6,218,219 B1* | 4/2001 | Yamazaki et al. | 438/149 |
| 6,294,274 B1 | 9/2001 | Kawazoe et al. | |
| 6,441,414 B1* | 8/2002 | Lim et al. | 257/295 |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,601,984 B2 | 10/2009 | Sano et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0276683 A1* | 11/2010 | Kim et al. | 257/43 |
| 2010/0295041 A1 | 11/2010 | Kumomi et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-274210 | 10/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165527 | 6/2006 |
| JP | 2006-165528 | 6/2006 |
| JP | 2006-165529 | 6/2006 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review letters), May 4, 1961, vol. 48, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Nakamura.M at al., "The phase relations in the In2O3—Ga2ZnO4—ZnO system at 1350°C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (M=7, 8, 9, and 16) in the In2O3—ZnGa2O4—ZnO System", Journal of Solid State Chemistry, Apr. 1, 1995, vol. 116, No. 1, pp. 170-178.

(56) References Cited

OTHER PUBLICATIONS

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using Cg-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED", IDW'06 : Proceedings of the 13th International Display Workshops, Dec. 7, 2006, pp. 663-668.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTs) for AMLCDS", Journal of the SID, 2007, vol. 15, No. 1, pp. 17-22.
Park.S et al., "Challenge to Future Displays: Transparent AM-OLED Driven by PEALD Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong,J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Cho.D et al., "21.2: Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Osada.T at al., "Development of Driver-Integrated Panel Using Amorphous In—Ga—Zn—Oxide TFT", AM-FPD '09 Digest of Technical Papers, Jul. 1, 2009, pp. 33-36.
Godo.H at al., "Temperature Dependence of Characteristics and Electronic Structure for Amorphous In—Ga—Zn—Oxide TFT", AM-FPD '09 Digest of Technical Papers, Jul. 1, 2009, pp. 41-44.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Park.J et al., "High performance amorphous oxide thin film transistors with self-aligned top-gate structure", IEDM 09: Technical Digest of International Electron Devices Meeting, Dec. 7, 2009, pp. 191-194.
Nakamura.M, "Synthesis of Homologous Compound with New Long-Period Structure", NIRIM Newsletter, Mar. 1, 1995, vol. 150, pp. 1-4.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Orita.M et al., "Amorphous transparent conductive oxide InGaO3(ZnO)m (m <4):a Zn4s conductor", Philosophical Magazine, 2001, vol. 81, No. 5, pp. 501-515.
Janotti.A at al., "Oxygen Vacancies in ZnO", Appl. Phys. Lett. (Applied Physics Letters) , 2005, vol. 87, pp. 122102-1-122102-3.

(56) References Cited

OTHER PUBLICATIONS

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A at al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J at al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J at al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H at al., "P-29:Modeling of Amorphous Oxide Semiconductor Thin Film Transistors and Subgap Density of States", SID Digest '08 : SID International Symposium Digest of Technical Papers, 2008, vol. 39, pp. 1277-1280.

Oba.F at al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K at al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation with Ultraviolent Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003; vol. 93, No. 3, pp. 1624-1630.

Oh.M et al., "Improving the Gate Stability of ZnO Thin-Film Transistors with Aluminum Oxide Dielectric Layers", J. Electrochem. Soc. (Journal of the Electrochemical Society), 2008. vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 with Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystallin InGaO3(ZnO)5 films", Appl. Phys. Lett. (Applied Physics Letters), Sep. 13, 2004, vol. 85, No. 11, pp. 1993-1995.

\* cited by examiner

MANUFACTURING METHOD AND TEST METHOD OF SEMICONDUCTOR DEVICE

BACKGROUND OF THE INVENTION

1. Field of the Invention

The present invention relates to a manufacturing method of a semiconductor device including a circuit including a transistor and a test method of the semiconductor device. The present invention relates to an electronic device equipped with a display device using an active element which is, for example, an active element including an oxide semiconductor, as a semiconductor element.

In this specification, a semiconductor device generally means any device which can function by utilizing semiconductor characteristics; an electrooptic device, a semiconductor circuit, and an electronic device are all included in the category of the semiconductor device.

2. Description of the Related Art

Although transistors using amorphous silicon have been used for conventional display devices typified by liquid crystal televisions, an oxide semiconductor has attracted attention as a material which replaces a silicon semiconductor. For example, an active matrix display device in which an amorphous oxide including In, Ga, and Zn is used for an active layer of a transistor and the electron carrier concentration of the amorphous oxide is lower than $10^{18}/cm^3$ is disclosed (see Patent Document 1).

However, there have been some problems in such a transistor using an oxide semiconductor. One of the problems is the stability of the characteristics; it has been pointed out that the electric characteristics of the transistor are changed by irradiation with visible light or ultraviolet light.

REFERENCE

Patent Document 1: Japanese Published Patent Application No. 2006-165528

SUMMARY OF THE INVENTION

End-product reliability of an electronic device using a plurality of transistors has not been assured in some cases where at least one of the transistors does not meet the certain standard on the shift amount of the threshold voltage by voltage stress.

One of test methods for examining reliability of a transistor is a bias-temperature stress test (hereinafter, referred to as a BT test). The BT test is a kind of accelerated test, and can evaluate a change in characteristics caused by long-term usage of a transistor. The amount of shift of the threshold voltage of a transistor through the BT test is particularly an important benchmark for the reliability. The smaller the amount of shift of the threshold voltage of a transistor through the BT test is, the higher the reliability of a product including the transistor is.

Specifically, the temperature of a substrate provided with the transistor (substrate temperature) is kept at a fixed temperature, a source and a drain of the transistor are set at the same potential as each other, and a gate of the transistor is applied with a potential different from those of the source and the drain for a certain period, for example, for 1 hour. The BT test in which the potential applied to the gate is higher than the potential of the source or the drain is referred to as a +BT test and the BT test in which the potential applied to the gate is lower than the potential of the source or the drain is referred to as a −BT test.

The BT test is performed on a transistor which has been never subjected to a BT test. For example, if a −BT test is performed on a transistor which has been once subjected to a +BT test, the results of the −BT test cannot be evaluated correctly due to influence of the previous +BT test. The same applies to the case where a +BT test is performed on a transistor which has been once subjected to a +BT test. Therefore, the BT test involves many samples and takes time.

Further, since the BT test is an accelerated test, a transistor suffers stress damage by the BT test and the transistor after being subjected to the BT test cannot be used in an end product. Therefore, it has been demanded that a Good/Not-Good test is conducted on a transistor and then, an end product is manufactured using the tested transistor; that is, a test method for evaluating and judging the reliability of a transistor, in a manufacturing process of a semiconductor device has been demanded.

One object of one embodiment of the present invention is to provide a test method by which a transistor whose reliability is low can be detected with low stress and high accuracy in a shorter period of time than a BT test.

One object of one embodiment of the present invention is to detect a transistor whose reliability is high in a shorter period of time than a BT test and manufacture an electronic device with high reliability efficiently.

One embodiment of the present invention is a test method for evaluating the reliability of a transistor. The method is also a test method of a semiconductor device, in which hysteresis characteristics of Id-Vg characteristics of a transistor, which are obtained by measuring the current (Id) between a drain electrode and a source electrode of the transistor while irradiating the transistor with light and changing the voltage (Vg) between a gate electrode of the transistor and the source electrode are analyzed.

Such hysteresis characteristics revealed in the result of the Vg-Id measurement with light irradiation to the transistor correlate with the result of a BT test; whether the reliability of the transistor is Good or Not-Good can be judged.

It is ideal that in the Vg-Id measurement with light irradiation to the transistor, a Vg-Id curve at a sweep of the gate voltage by a certain voltage from negative voltage to positive voltage be substantially coincide with a Vg-Id curve at a sweep of the gate voltage by the certain voltage from positive voltage to negative voltage.

The test for evaluating the reliability with the measurement of the electrical characteristics of a transistor with light irradiation can be applied as one step of a manufacturing process of a semiconductor device. According to a manufacturing method of a semiconductor device in that case, transistors are manufactured, Good/Not-Good judgment is conducted using Id-Vg curves of each of the transistors obtained by measuring the drain-source current (Id) of the transistor while irradiating the transistor with light and changing the gate-source voltage (Vg) of the transistor, and then, the semiconductor device is manufactured using the transistor(s) which is/are judged to be Good.

In particular, it has been confirmed that in the case where an oxide semiconductor material is used for a semiconductor layer of a transistor, a −BT test, i.e., application of a negative gate stress, with light irradiation accelerates the degradation of the transistor to make the transistor be in the normally-ON state. This degradation is also called negative-bias temperature stress photodegradation.

A transistor exhibiting large negative-bias temperature stress photodegradation shows a large difference between a Vg-Id curve at a sweep of the gate voltage from negative voltage to positive voltage by a certain voltage (e.g., 0.25 V)

and a Vg-Id curve at a sweep of the gate voltage from positive voltage to negative voltage by the certain voltage.

On the other hand, a transistor exhibiting small negative-bias temperature stress photodegradation tends to show a small difference between a Vg-Id curve at a sweep of the gate voltage from negative voltage to positive voltage by a certain voltage and a Vg-Id curve at a sweep of the gate voltage from positive voltage to negative voltage by the certain voltage.

In this specification, an oxide semiconductor material means a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; an In—O-based oxide semiconductor, a Sn—O-based oxide semiconductor, or a Zn—O-based oxide semiconductor; or the like. Further, $SiO_2$ may be contained in the above oxide semiconductor. Here, for example, an In—Ga—Zn—O-based oxide semiconductor means an oxide containing indium (In), gallium (Ga), and zinc (Zn), and there is no particular limitation on the composition ratio thereof. The In—Ga—Zn—O-based oxide semiconductor may contain an element other than In, Ga, and Zn.

In the case where an In—Zn—O-based material is used as an oxide semiconductor, a target therefore has a composition ratio of In:Zn=50:1 to 1:2 in atomic ratio ($In_2O_3$:ZnO=25:1 to 1:4 in molar ratio), preferably In:Zn=20:1 to 1:1 in atomic ratio ($In_2O_3$:ZnO=10:1 to 1:2 in molar ratio), further preferably In:Zn=15:1 to 1.5:1 in atomic ratio ($In_2O_3$:ZnO=15:2 to 3:4 in molar ratio). For example, in a target used for formation of an In—Zn—O-based oxide semiconductor which has an atomic ratio of In:Zn:O=X:Y:Z, the relation of Z>1.5X+Y is satisfied.

According to one embodiment of the present invention, a test method by which a transistor whose reliability is low can be detected with low stress and high accuracy in a shorter period of time than a BT test can be provided.

According to one embodiment of the present invention, a transistor whose reliability is high can be detected in a shorter period of time than a BT test and an electronic device with high reliability can be manufactured efficiently.

BRIEF DESCRIPTION OF THE DRAWINGS

FIGS. 7A-1 and 7A-2, 7B-1 and 7B-2, 7C-1 and 7C-2, and 7D-1 and 7D-2 are graphs showing simulation results.

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

Described in Embodiment 1 is a relation between degradation with light irradiation to a transistor using an In—Ga—Zn—O-based oxide semiconductor which is a ternary metal oxide and hysteresis characteristics of the transistor.

Figure 10A:
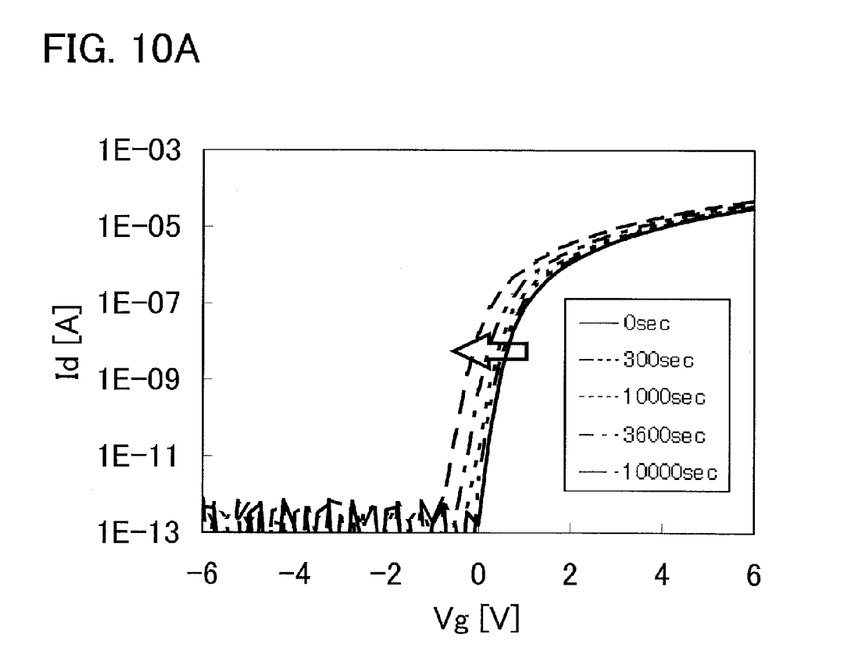
FIGS. 10A and 10B are graphs showing results of −BT tests (Comparative Examples)

First, results of a −BT test on a transistor (L/W=3 μm/50 μm) using an In—Ga—Zn—O-based oxide semiconductor are shown in FIG. 10A. The −BT test was conducted at a drain-source voltage (Vd) of 3 V and a gate-source voltage (Vg) of −6 V such that the intensity of an electric field applied to a gate insulating film is −2 MV/cm. The application of the negative gate stress was kept for 0 seconds, 300 seconds, 1000 seconds, 3600 seconds, and 10000 seconds, Vg-Id curves for which showed that the Vg-Id curve shifts in a negative direction (a direction indicated by an arrow in FIG. 10A) as the kept time gets longer.

Figure 10B:
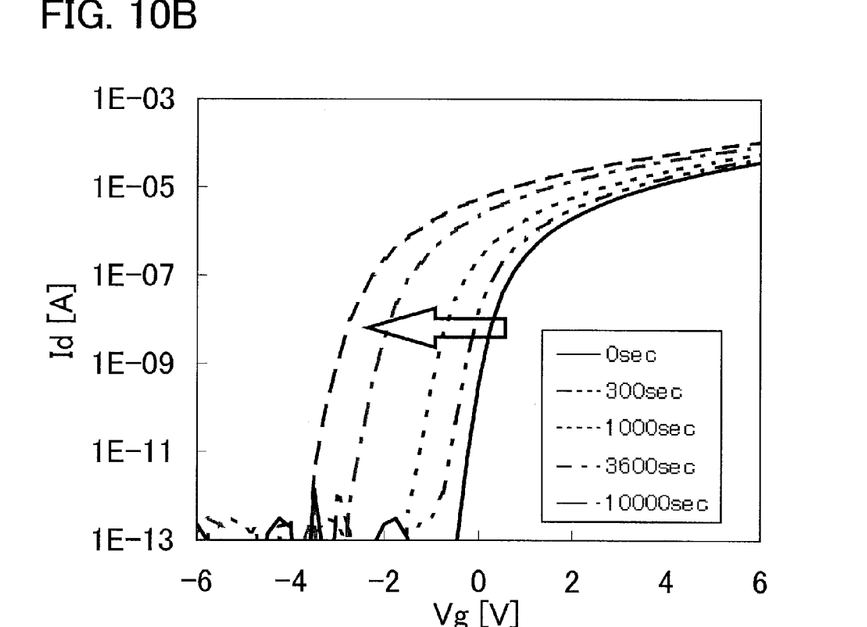

Further, results of the −BT test with light irradiation using an LED light source (white light with 36000 lux) are shown in FIG. 10B. As compared with FIG. 10A with no light irradiation, the Vg-Id curves shifted further in the negative direction in FIG. 10B. The substrate temperature in the −BT test was set to room temperature.

Figure 3:
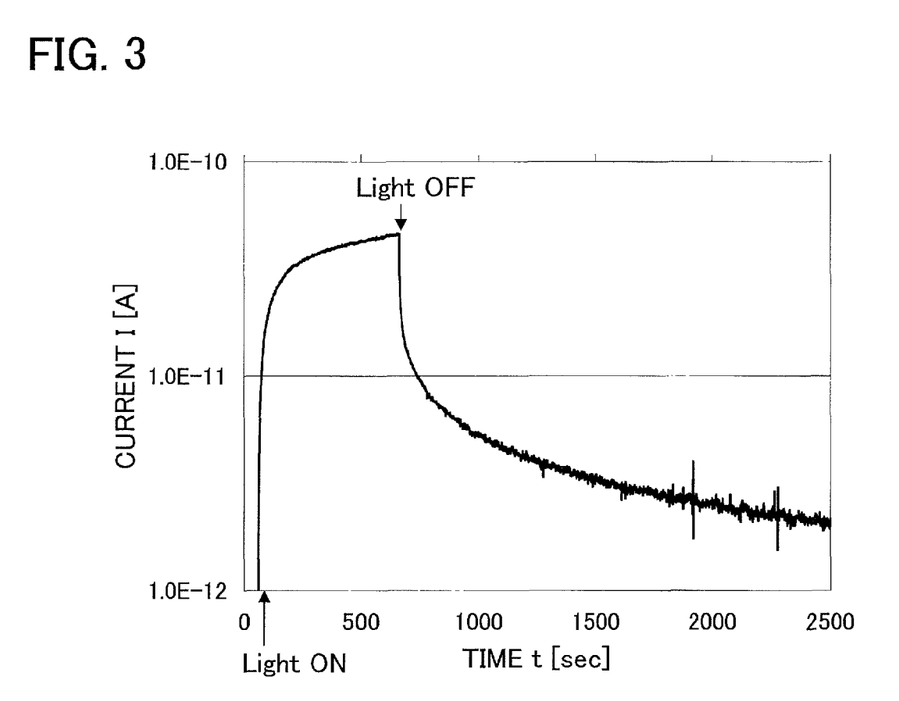
FIG. 3 is a graph showing photoresponse characteristics.

The photoresponse characteristics of the transistor using an In—Ga—Zn—O-based oxide semiconductor are shown in FIG. 3. White light with a wavelength (λ) of 400 nm was used as a light source. In FIG. 3, a timing at which the light source is turned on is indicated by an upward arrow, and a timing at which the light source is turned off after white light irradiation for 600 seconds is indicated by a downward arrow. As shown in FIG. 3, a relaxation time τ of the transistor using an In—Ga—Zn—O-based oxide semiconductor is long. The relaxation time τ depends on a model of carrier recombination. The long relaxation time τ is caused by, for example, slowness of relaxation of extinction of an electron-hole pair generated by light in the In—Ga—Zn—O-based oxide semiconductor.

The transistor using the In—Ga—Zn—O-based oxide semiconductor exhibited hysteresis characteristics in Vg-Id characteristics measured at room temperature with irradiation with light (λ=350 nm). The results are shown in FIGS. 1A and 1B.

Figure 2:
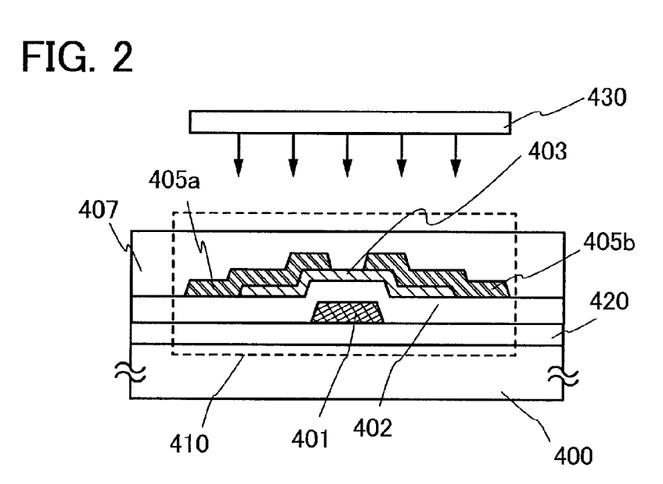
FIG. 2 illustrates a cross-sectional structure illustrating one embodiment of the present invention.

A cross-sectional structure of a transistor which is one embodiment of the transistor using the In—Ga—Zn—O-based oxide semiconductor, which was measured with irradiation with light (λ=350 nm) from a light source 430 is shown in FIG. 2. A transistor 410 illustrated in FIG. 2 is a bottom-gate transistor and is also called an inverted staggered transistor.

The transistor 410 includes, over a substrate 400 having an insulating surface, an insulating layer 420 including an insulating material, a gate electrode 401, a gate insulating layer 402 including an insulating material, an oxide semiconductor layer 403, a source electrode 405a, and a drain electrode 405b. Further, a buffer layer 407 including an insulating material, which covers the transistor 410 and is in contact with the oxide semiconductor layer 403 is provided.

Figure 1A:
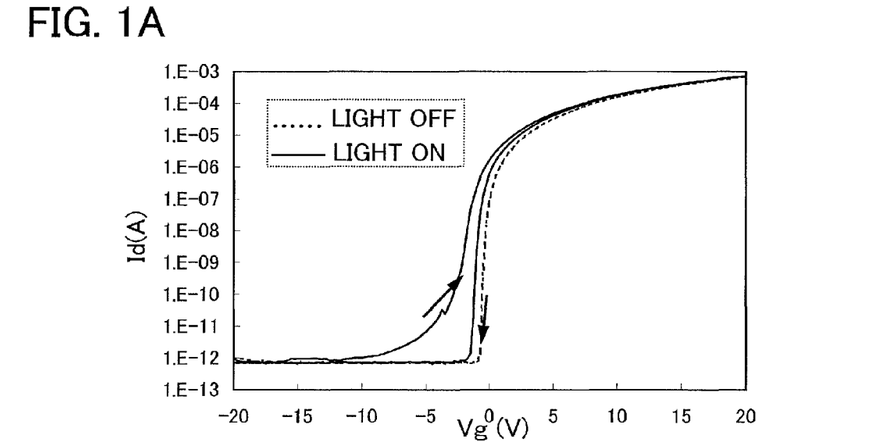
FIGS. 1A and 1B are graphs illustrating one embodiment of the present invention.
Figure 1B:
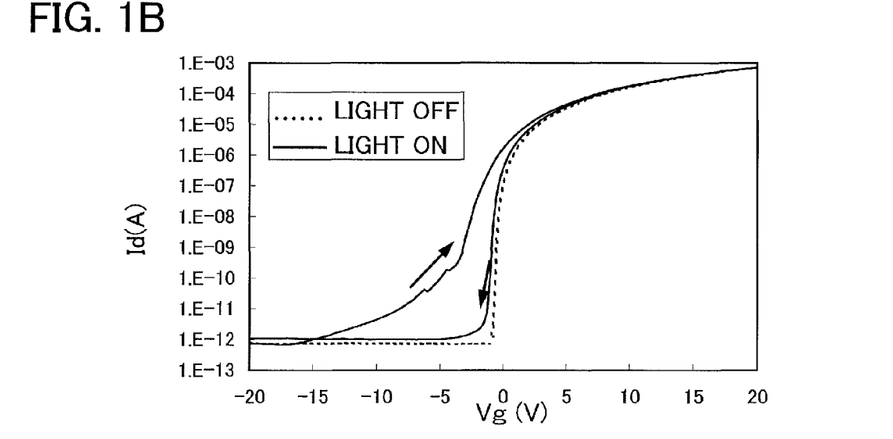

In the Vg-Id measurement whose results are shown in FIGS. 1A and 1B, the gate voltage was changed (swept) by 0.25 V from −20 V to +20 V, and then to −20 V. Two kinds of measurements were performed: the measurement in which the integration time for one step (0.25 V) was set short to change the gate voltage fast (Fast Sweep); and the measurement in which the integration time for one step was set long to change the gate voltage slowly (Slow Sweep). The results of the measurement in which the gate voltage was changed fast (Fast Sweep) are shown in FIG. 1A, and the results of the measurement in which the gate voltage was changed slowly (Slow Sweep) are shown in FIG. 1B. Table 1 shows respective integration times in Fast Sweep and Slow Sweep. For the convenience of a measuring equipment, the integration time for one step was changed in accordance with a drain current to be measured.

TABLE 1

| Range of DrainCurrent | Fast Sweep | Slow Sweep |
|---|---|---|
| ~10 pA | 1 sec | 2 sec |
| 10 pA~100 pA | 0.2 sec | 3.2 sec |
| 100 pA~1 nA | 0.1 sec | 1.6 sec |
| 1 nA~1 A | 0.02 sec | 0.32 sec |

The results of the Vg-Id measurement with no light irradiation are also shown in FIGS. 1A and 1B, in which no hysteresis characteristics are observed.

In each of FIGS. 1A and 1B, hysteresis characteristics are observed in the cases with light irradiation (λ=350 nm); in particular, the Vg-Id curve is shifted in a negative direction in the case at the sweep from −20 V to +20 V. In addition, the hysteresis characteristics are more apparent in Slow Sweep than in Fast Sweep.

In the Vg-Id characteristics with light irradiation in each of FIGS. 1A and 1B, when the Vg-Id curve at the sweep from −20 V to +20 V is compared to the Vg-Id curve at the sweep from +20 V to −20 V, there is a particularly large difference (Δshift) in a rising portion of the Vg-Id curves. The transistor characteristics in such a rising portion are important particularly in a device which is greatly affected by the value of off-state current. The shift value, which is one characteristic value of a transistor in a rising portion, means a voltage value at a rising of the Vg-Id curve and corresponds to a voltage at a drain-source current (Id) of $1 \times 10^{-12}$ A.

The following mechanism was assumed as a cause of the hysteresis characteristics.

A combination of light irradiation and application of a negative gate voltage induces a hole in the In—Ga—Zn—O-based oxide semiconductor (particularly in a vicinity of the interface with the gate insulating film). If a trap for capturing a hole exists in the bandgap, the hole is captured and remains in the vicinity of the interface with the gate insulating film as a positive charge, which causes a shift of the Vg-Id curve in the negative direction.

The sweep from −20 V to +20 V shifts the curve in the negative direction with a captured hole remaining in the vicinity of the interface due to the negative gate voltage. On the other hand, the sweep from +20 V to −20 V does not shift the curve in the negative direction because a hole is excluded by the positive gate voltage. The difference in the hysteresis characteristics depending on the sweep speed between FIGS. 1A and 1B is affected by the reaction speed of a hole and a trap. In an oxide semiconductor, the reaction speed between a hole and a trap is very slow; a hole generated by light irradiation takes a long time to be captured, and once captured, the hole also takes a long time to be released.

To confirm the above-described assumed mechanism, verification using device simulation was conducted. For the simulation, a device simulator "Atlas" produced by Silvaco, Inc. was used.

Main parameters adopted in the simulation are listed in Table 2.

TABLE 2

| Temperature | 300 K |
|---|---|
| Bandgap | 3.15 eV |
| Electronic affinity | 4.3 eV |
| Permittivity | 10 |
| Mobility (electron) | 10 cm$^2$/Vs |
| Work function (S/D) | 4.0 eV |
| Work function (gate) | 4.9 eV |

Further, formulae of a recombination model adopted in the simulation are shown in Formula 1 and Formula 2.

$$R = \frac{pn - n_i^2}{\tau_n\left[p + n_i \exp\left(\frac{E_i - E_{trap}}{kT}\right)\right] + \tau_p\left[n + n_i \exp\left(\frac{E_{trap} - E_i}{kT}\right)\right]} \quad \text{(Formula 1)}$$

$$\tau_n = \tau_p = 1.0 \text{ msec} \quad \text{(Formula 2)}$$

Figure 6A:
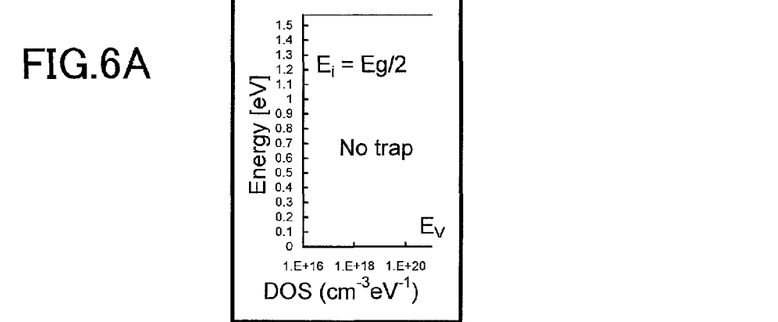
FIGS. 6A to 6D are graphs of considering a donor trap (a trap capturing a hole) in a bandgap.
Figure 6B:
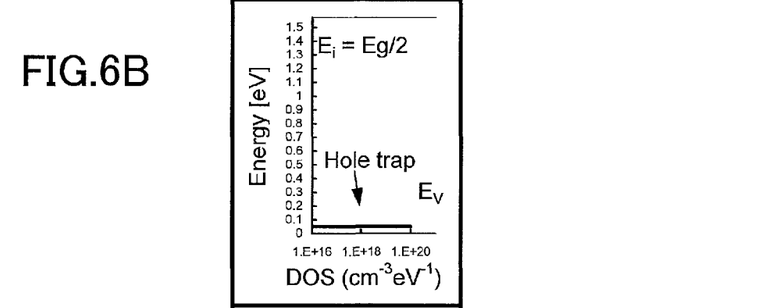
Figure 6C:
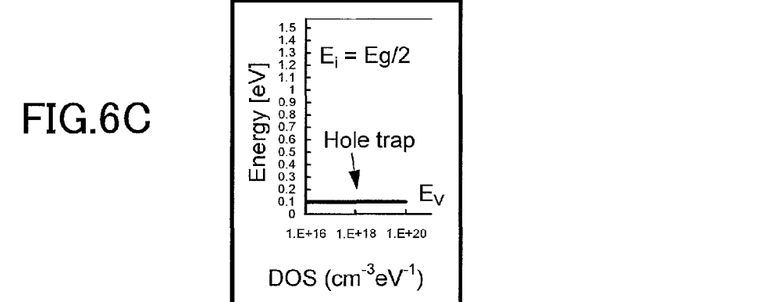
Figure 6D:
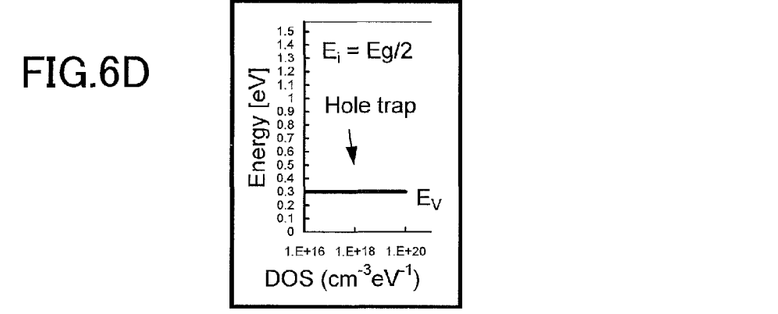
Figure 7A:
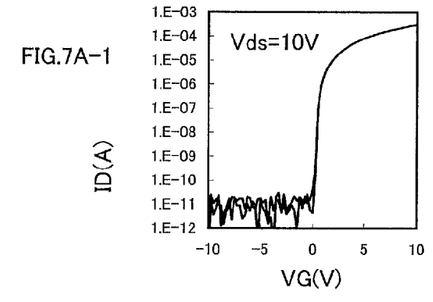
Figure 7A:
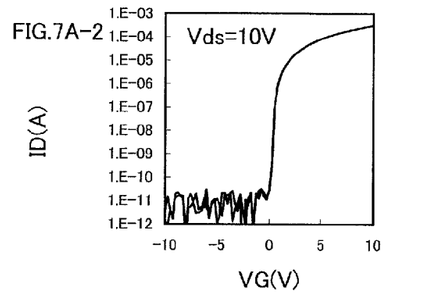
Figure 7B:
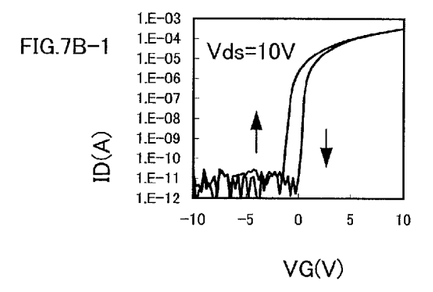
Figure 7B:
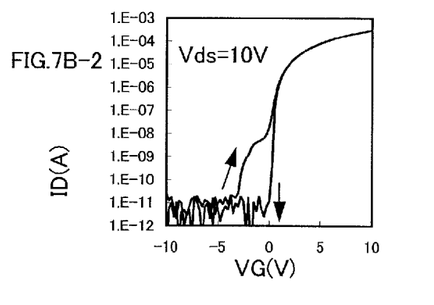
Figure 7C:
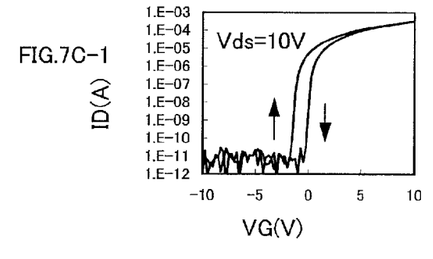
Figure 7C:
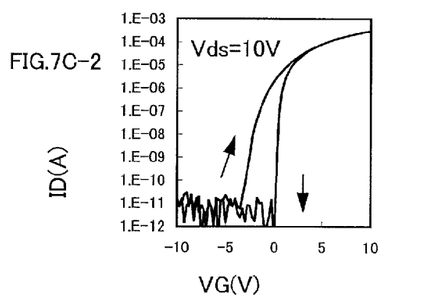
Figure 7D:
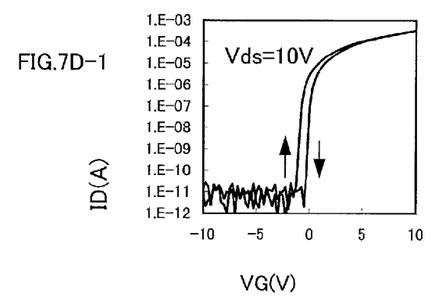
Figure 7D:
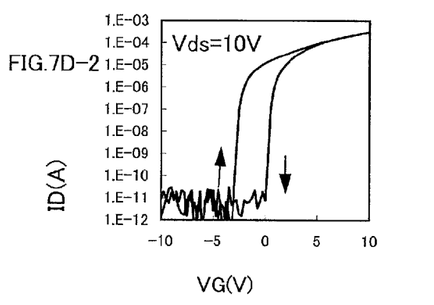

For the simulation, a transistor whose structure is the same as that of the above-described measured transistor was hypothesized and traps as shown in FIGS. 6A to 6D were assumed in the bandgap of the In—Ga—Zn—O-based oxide semiconductor. No trap is included in the bandgap of FIG. 6A, and a donor trap (trap for capturing a hole) is included in the bandgap in each of FIGS. 6B to 6D. FIGS. 6B to 6D are different in the energy difference from the valence band (Ev) to the trap. The simulation results are shown in FIGS. 7A-1 and 7A-2, 7B-1 and 7B-2, 7C-1 and 7C-2, and 7D-1 and 7D-2. The simulation results of Fast Sweep and Slow Sweep of FIG. 6A are FIGS. 7A-1 and 7A-2, respectively. The simulation results of Fast Sweep and Slow Sweep of FIG. 6B are FIGS. 7B-1 and 7B-2, respectively. The simulation results of Fast Sweep and Slow Sweep of FIG. 6C are FIGS. 7C-1 and 7C-2, respectively. The simulation results of Fast Sweep and Slow Sweep of FIG. 6D are FIGS. 7D-1 and 7D-2, respectively. It can be seen from the verification results that in the cases where the presence of a donor trap was assumed as an in-gap level, the hysteresis characteristics observed in the measurement results reappeared. It was also confirmed that in the cases where the trap exists near the valence band (FIGS. 6B and 6C), the hysteresis characteristics tend to be small. It can be assumed that this is because a captured hole is easily detrapped into the valence band even at a low temperature such as room temperature.

Further, as a cause of the difference in the hysteresis characteristics depending on the sweep speed in the measurement results, the following mechanism can be given: the reaction speed between a hole and a trap is very slow, and a hole generated by light irradiation takes a long time to be captured, and once captured, the hole also takes a long time to be released. In the simulation of this embodiment, $\tau_n$ and $\tau_p$ in the Formula 2 were set to high values. In this manner, the tendency of the measurement results reappeared.

Figure 8:
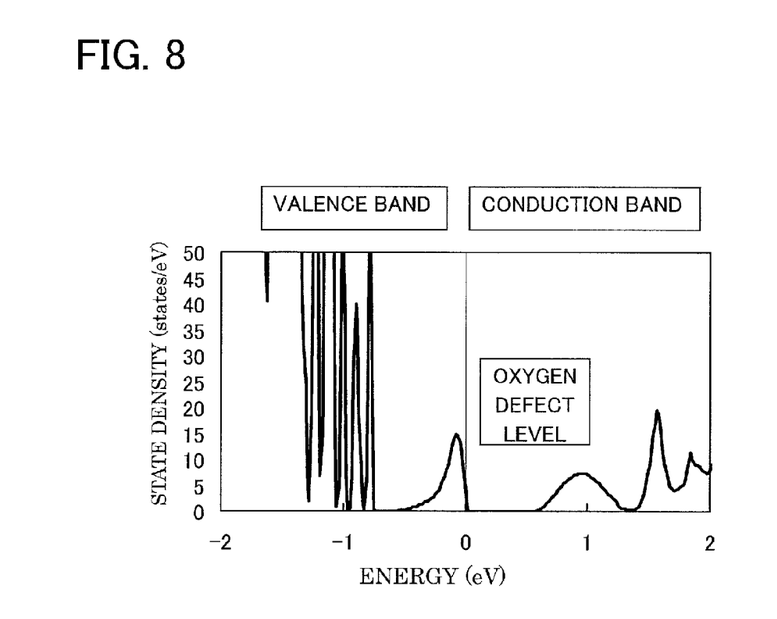
FIG. 8 is a graph showing a state density in an oxygen-deficient state.

Finally, a donor level is considered below. An oxygen defect is given as an example of a defect level of a layer of an oxide semiconductor typified by an In—Ga—Zn—O-based oxide semiconductor. It is considered that electrons are localized in the case where vacancy owing to an oxygen defect is left. The state density of an oxygen-deficient state with oxygen vacancy left in an In—Ga—Zn—O-based oxide semiconductor is shown in FIG. 8. Simulation thereof was performed using Vienna Ab-initio Simulation Package (VASP), from which it can be found that the oxygen defect with vacancy left forms a deep level. In that case, the defect level is occupied with electrons and captures a hole because the defect level is close to the valence band. This defect level corresponds to the donor level capturing a hole assumed in the simulation.

Figure 9:
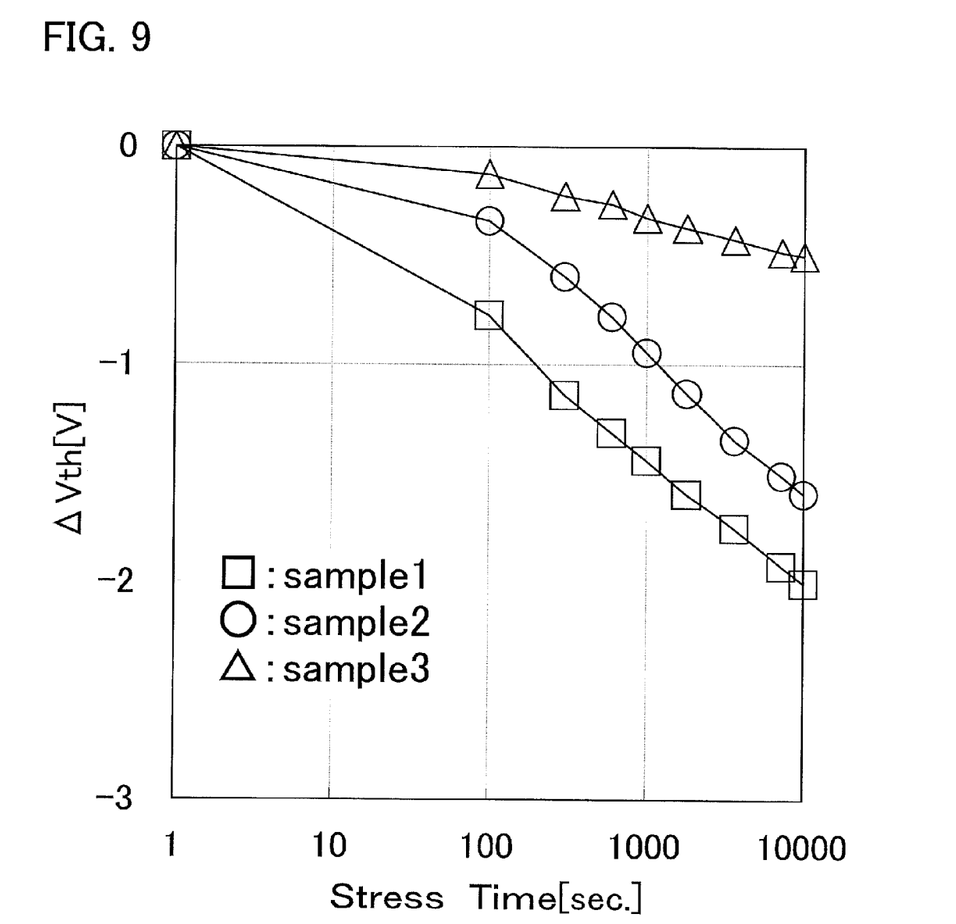
FIG. 9 is a graph showing results of a −BT test.

FIG. 9 shows threshold changes ($\Delta$Vth) of transistors in good results of a –BT test. Sample 3 is a transistor with the highest reliability among Samples 1, 2, and 3. Also for these transistors, with the Vg-Id measurement with light irradiation, results of which correlate with results of a –BT test, and thus, whether the reliability of each transistor is good or not good can be judged using the hysteresis characteristics. Negative-bias temperature stress photodegradation is a phenomenon in which a long period of stress application makes it impossible to detrap trapped holes from the trap, and is caused by hole trapping, like the hysteresis characteristics. Therefore, according to the Vg-Id measurement with light irradiation, the sample with the smallest change is Sample 3 among Samples 1, 2, and 3, which coincides with the results of the –BT test.

Good/Not-Good judgment using hysteresis characteristics with the Id-Vg measurement is efficient in a shorter period of measurement than a BT test.

Embodiment 2

In Embodiment 2, an example of the case where a test using hysteresis characteristics is performed in a manufacturing process of a semiconductor device will be described.

An example of the manufacturing method of the transistor 410 is described using FIG. 2, below.

First, the insulating layer 420 serving as a base insulating layer is formed over the substrate 400. As the insulating layer 420, an insulating film including an inorganic insulating material is formed by a sputtering method, a PCVD method, or the like. Typically, an inorganic insulating film such as a silicon oxide film, a silicon oxynitride film, an aluminum oxide film, or a gallium oxide film can be used as the insulating layer 420.

Although there is no particular limitation on a material and the like of the substrate 400, it is necessary that the substrate have heat resistance high enough to withstand at least a heat treatment performed later. For example, a glass substrate, a ceramic substrate, a quartz substrate, a sapphire substrate, or the like can be used as the substrate 400. Alternatively, a single crystal semiconductor substrate or a polycrystalline semiconductor substrate of silicon, carbon silicon, or the like; a compound semiconductor substrate of silicon germanium or the like; an SOI substrate; or the like can be used. Any of these substrates over which a semiconductor element is provided may be used as the substrate 400.

A flexible substrate may be used as the substrate 400. In the case where a transistor is provided over the flexible substrate, the transistor may be formed directly on the flexible substrate, or the transistor may be formed over a different substrate and then separated to be transferred to the flexible substrate. In order to separate the transistor to transfer to the flexible substrate, a separation layer is preferably formed between the different substrate and the transistor.

Next, the gate electrode 401 is formed over the insulating layer 420. The gate electrode 401 can be formed to have a single-layer structure or a multi-layer structure using a metal material such as Mo, Ti, Cr, Ta, W, Al, Cu, Nd or Sc, and/or an alloy material containing the above metal material as its main component.

Then, the gate insulating layer 402 covering the gate electrode 401 is formed. The thickness of the gate insulating layer 402 is greater than or equal to 100 nm and less than or equal to 500 nm; for example, a first gate insulating layer having a thickness greater than or equal to 50 nm and less than or equal to 200 nm and a second gate insulating layer having a thickness greater than or equal to 5 nm and less than or equal to 300 nm are stacked in this order.

As the gate insulating layer 402, an insulating film including an inorganic insulating material is formed by a sputtering method, a PCVD method, or the like. Typically, an inorganic insulating film such as a silicon oxide film, a silicon oxynitride film, an aluminum oxide film, or a gallium oxide film can be used as the gate insulating layer 402. In this embodiment, a 30-nm-thick silicon oxynitride film is formed.

Then, an oxide semiconductor film is formed to a thickness greater than or equal to 5 nm and less than or equal to 200 nm over the gate insulating layer 402. In this embodiment, the oxide semiconductor film is formed using a target for deposition of an oxide semiconductor, which contains In, Ga, and Zn ($In_2O_3:Ga_2O_3:ZnO$ is 1:1:2 in molar ratio) under conditions where the distance between the substrate and the target is 100 mm, the pressure is 0.6 Pa, the direct current (DC) power is 5 kW, the atmosphere is an oxygen atmosphere (the proportion of the oxygen flow is 50%), and the substrate temperature is 200° C.

Next, the oxide semiconductor film is processed into the island-shaped oxide semiconductor layer 403 by a photolithography process.

Next, the oxide semiconductor layer 403 is dehydrated or dehydrogenated. First heat treatment for dehydration or dehydrogenation is performed at a temperature higher than or equal to 400° C. and lower than a strain point of the substrate, preferably higher than or equal to 425° C. In this embodiment, heat treatment is performed at 650° C. for 6 minutes, and then, heat treatment is performed at 450° C. for 1 hour in an atmosphere in which nitrogen and oxygen are mixed.

The heat treatment for dehydration or dehydrogenation of the oxide semiconductor layer may be performed on the oxide semiconductor film which has not been processed into the island-shaped oxide semiconductor layer. In that case, the substrate is taken out of the heat treatment apparatus after the heat treatment; then, a photolithography process is performed thereon.

Next, a conductive film is formed over the gate insulating layer 402 and the oxide insulating layer 403. Then, a resist mask is formed by a photolithography process, and selective etching is performed thereon to form the source electrode 405a and the drain electrode 405b. The source electrode 405a and the drain electrode 405b each can be formed to have a single-layer structure or a multi-layer structure using a metal material such as Mo, Ti, Cr, Ta, W, Al, Cu, Nd or Sc, and/or an alloy material containing the above metal material as its main component.

In this embodiment, two transistors are manufactured: Sample A in which a 200-nm-thick titanium (Ti) film is used as each of the source electrode 405a and the drain electrode 405b; Sample B in which a 200-nm-thick tungsten (W) film is used as each of the source electrode 405a and the drain electrode 405b.

Next, the resist mask is removed, and then, heat treatment is performed thereon at 300° C. for 1 hour in a nitrogen atmosphere.

Next, the buffer layer 407 covering the transistor 410 is formed. The buffer layer 407 is formed to have a single-layer structure or a multi-layer structure of an insulating film using an inorganic insulting material, an insulating film using an organic insulting material, or the like by a sputtering method, a PCVD method, or the like. As the buffer layer 407, an inorganic insulating film such as a silicon oxide film, a silicon oxynitride film, an aluminum oxide film, or a gallium oxide film, and/or an organic insulating film of an acrylic resin, a polyimid resin, or the like can be used. In this embodiment, a multi layer of a 300-nm-thick silicon oxide film formed by a sputtering method and a 1.5-μm-thick acrylic resin film is used as the buffer layer 407.

Next, though not shown in FIG. 2, contact holes are formed in the buffer layer and connection electrodes which are connected to the source electrode 405a and the drain electrode 405b are formed.

Next, with light irradiation at 36000 1x with a white LED (manufactured by Moritex Corporation, a direct-below-type backlight MDBL-CW100), Vg-Id measurement is performed using as terminals the connection electrodes connected to the source electrode 405a and the drain electrode 405b. The light irradiation to the transistor 410 is performed as illustrated in FIG. 2.

The Vg-Id measurement was performed while irradiating the two transistors which are different in the materials of the source electrode 405a and the drain electrode 405b, with light, and the Vg-Id curve at a sweep from −6 V to +6 V by 0.25 V was compared to the Vg-Id curve at a sweep from +6 V to −6 V by 0.25 V.

Figure 4A:
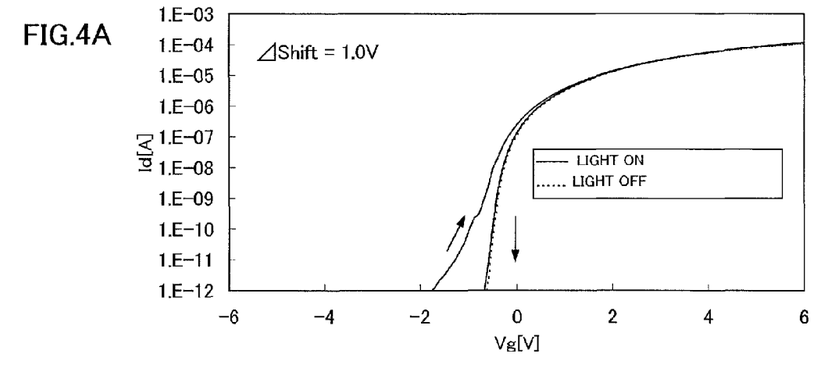
FIGS. 4A and 4B are graphs illustrating one embodiment of the present invention.
Figure 4B:
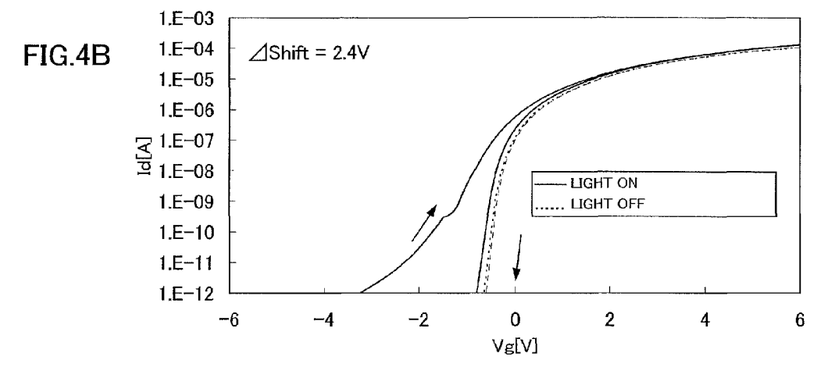

As for the measurement of Sample A in which the Ti film is used as the material of the source electrode 405a and the drain electrode 405b, results of the measurement in which the integration time for one step (0.25 V) was set short to change the gate voltage fast (Fast Sweep) are shown in FIG. 4A, and results of the measurement in which the integration time for one step was set long to change the gate voltage slowly (Slow Sweep) are shown in FIG. 4B. The sweep rates of the Fast Sweep and the Slow Sweep are as listed in Table 1. The value of ΔShift in FIG. 4A was 1.0 V and the value of ΔShift in FIG. 4B was 2.4 V.

Figure 5A:
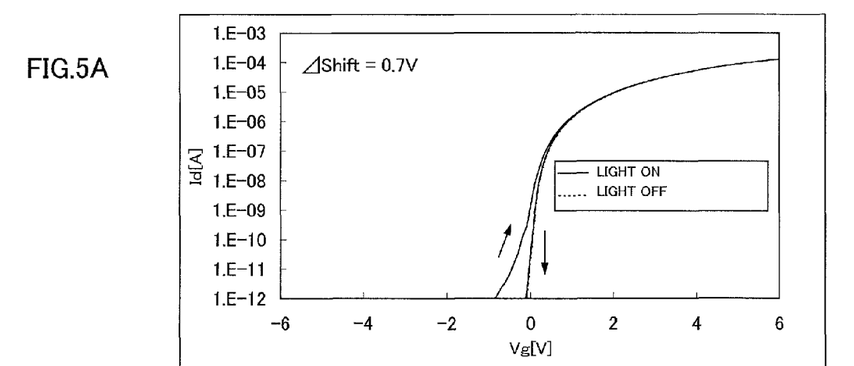
FIGS. 5A and 5B are graphs illustrating one embodiment of the present invention.
Figure 5B:
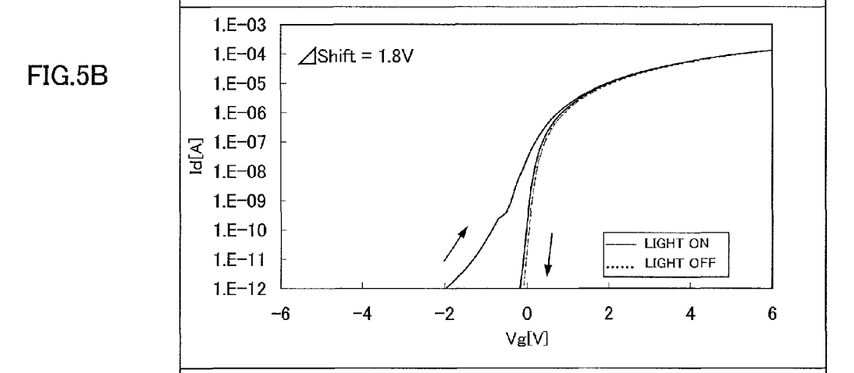

As for the measurement of Sample B in which the W film is used as the material of the source electrode 405a and the drain electrode 405b, results of the measurement in which the integration time for one step (0.25 V) was set short to change the gate voltage fast (Fast Sweep) are shown in FIG. 5A, and results of the measurement in which the integration time for one step was set long to change the gate voltage slowly (Slow Sweep) are shown in FIG. 5B. The value of ΔShift in FIG. 5A was 0.7 V and the value of ΔShift in FIG. 5B was 1.8 V.

The size of the transistor 410 is L/W=3 μm/50 μm.

Comparing Sample A to Sample B, the Vg-Id curve of Sample A using the Ti film was further shifted in a negative direction.

Figure 4C:
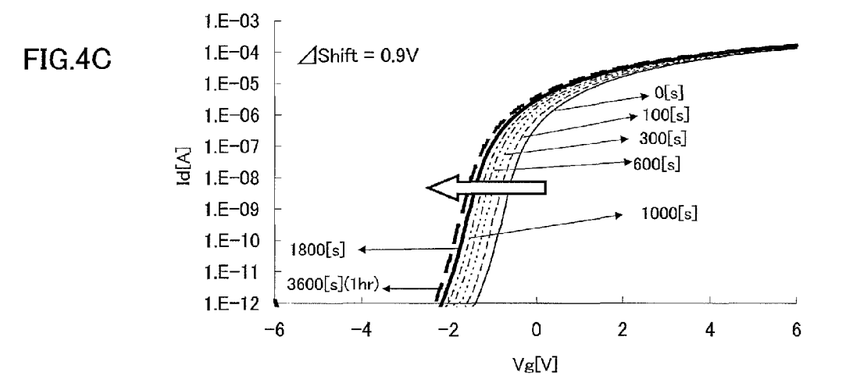
FIG. 4C is a graph illustrating a comparative example.
Figure 5C:
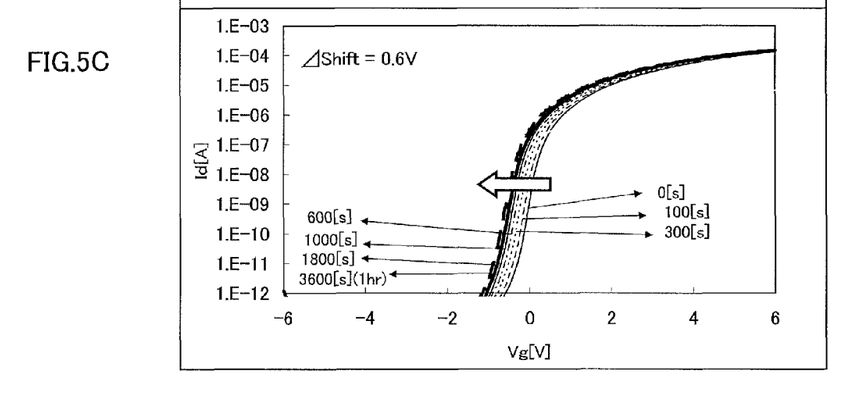
FIG. 5C is a graph illustrating a comparative example.

Further, results of a −BT test on Samples A and B are shown in FIGS. 4C and 5C, respectively. These results show correlation between the result of a −BT test and the result of hysteresis characteristics. The value of ΔShift in FIG. 4C was 0.9 V and the value of ΔShift in FIG. 5C was 0.6 V.

In this manner, the Vg-Id characteristics of a transistor are measured while irradiating the transistor with light and a Good/Not-Good test is performed on the transistor, and then, the tested transistor can be included in an end-product such as a liquid crystal display device or a semiconductor chip. Without performing a BT test, a Good/Not-Good test can be performed on a transistor in a short period of time, and the transistor can be included in an end-product; accordingly, an electronic device with high reliability can be manufactured efficiently.

This application is based on Japanese Patent Application serial No. 2010-145410 filed with Japan Patent Office on Jun. 25, 2010, the entire content of which is hereby incorporated by reference.

What is claimed is:

1. A test method for evaluating a reliability of a transistor, comprising:
    obtaining a first Id-Vg curve of the transistor by measuring Id with increasing Vg from a negative value to a positive value under irradiation of light;
    obtaining a second Id-Vg curve of the transistor by measuring Id with decreasing Vg from the positive value to the negative value under irradiation of light after obtaining the first Id-Vg curve; and
    analyzing hysteresis characteristics of the first Id-Vg curve and the second Id-Vg curve of the transistor,
    where a voltage between a gate electrode and a source electrode of the transistor is Vg, and a current between a drain electrode of the transistor and the source electrode is Id.

2. The test method for evaluating a reliability of a transistor according to claim 1, wherein the transistor includes an oxide semiconductor layer.

3. The test method for evaluating a reliability of a transistor according to claim 2, wherein the transistor includes In—Ga—Zn—O-based oxide semiconductor.

4. A test method for evaluating a reliability of a transistor, comprising:
    obtaining a first Id-Vg curve of the transistor by measuring Id with increasing Vg from a negative value to a positive value under irradiation of light;
    obtaining a second Id-Vg curve of the transistor by measuring Id with decreasing Vg from the positive value to the negative value under irradiation of light after obtaining the first Id-Vg curve; and
    performing a test for Good/Not-Good judgment on the transistor based on a shift of the first Id-Vg curve of the transistor from the second Id-Vg curve,
    where a voltage between a gate electrode and a source electrode of the transistor is Vg, and a current between a drain electrode of the transistor and the source electrode is Id.

5. The test method for evaluating a reliability of a transistor according to claim 4, wherein the transistor includes an oxide semiconductor layer.

6. The test method for evaluating a reliability of a transistor according to claim 5, wherein the transistor includes In—Ga—Zn—O-based oxide semiconductor.

7. A method for manufacturing a semiconductor device, comprising:
    manufacturing a transistor;
    subsequently obtaining a first Id-Vg curve of the transistor by measuring Id with increasing Vg from a negative value to a positive value under irradiation of light;
    obtaining a second Id-Vg curve of the transistor by measuring Id with decreasing Vg from the positive value to the negative value under irradiation of light after obtaining the first Id-Vg curve;
    performing a test for Good/Not-Good judgment, using the first Id-Vg curve of the transistor; and
    manufacturing the semiconductor device, using the transistor,
    wherein the first Id-Vg curve and the second Id-Vg curve are obtained by measuring a current (Id) between a drain electrode and a source electrode of the transistor with changing a voltage (Vg) between a gate electrode of the transistor and the source electrode.

8. The method for manufacturing a semiconductor device according to claim 7, wherein the transistor includes an oxide semiconductor layer.

9. The method for manufacturing a semiconductor device according to claim 7, wherein the manufacturing of the transistor comprises:
    forming a base insulating layer over a substrate; and
    forming the transistor over the base insulating layer.

10. The method for manufacturing a semiconductor device according to claim 9, wherein the base insulating layer comprises an inorganic insulating material.

11. The method for manufacturing a semiconductor device according to claim 7, wherein the transistor is formed over a flexible substrate.

12. The method for manufacturing a semiconductor device according to claim 7, wherein the manufacturing of the transistor comprises:
    forming the gate electrode over a substrate;
    forming a gate insulating layer over the gate electrode;
    forming a semiconductor film over the gate insulating layer; and
    forming the source electrode and the drain electrode over the semiconductor film.

13. The method for manufacturing a semiconductor device according to claim 12, wherein the gate insulating layer comprises an inorganic insulating material.

14. The method for manufacturing a semiconductor device according to claim 12, wherein the gate insulating layer has a thickness greater than or equal to 100 nm and less than or equal to 500 nm.

15. The method for manufacturing a semiconductor device according to claim 7, wherein the transistor includes In—Ga—Zn—O-based oxide semiconductor.

* * * * *